(12) United States Patent
Furukawa et al.

(10) Patent No.: US 7,211,844 B2
(45) Date of Patent: May 1, 2007

(54) VERTICAL FIELD EFFECT TRANSISTORS INCORPORATING SEMICONDUCTING NANOTUBES GROWN IN A SPACER-DEFINED PASSAGE

(75) Inventors: Toshiharu Furukawa, Essex Junction, VT (US); Mark Charles Hakey, Fairfax, VT (US); Steven John Holmes, Guilderland, NY (US); David Vaclav Horak, Essex Junction, VT (US); Peter H. Mitchell, Jericho, VT (US); Larry Alan Nesbit, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 87 days.

(21) Appl. No.: 10/767,039

(22) Filed: Jan. 29, 2004

(65) Prior Publication Data

US 2005/0167740 A1 Aug. 4, 2005

(51) Int. Cl.
*H01L 29/76* (2006.01)
(52) U.S. Cl. .................. 257/213; 257/220; 257/263
(58) Field of Classification Search ............ 257/213, 257/220, 263, 365
See application file for complete search history.

(56) References Cited

U.S. PATENT DOCUMENTS

| | | |
|---|---|---|
| 5,796,573 A | 8/1998 | Kotecki et al. |
| 6,250,984 B1 | 6/2001 | Jin et al. ............... 445/51 |
| 6,423,583 B1 | 7/2002 | Avouris et al. ......... 438/132 |
| 6,515,325 B1 | 2/2003 | Farnworth et al. ...... 257/296 |
| 6,858,891 B2 | 2/2005 | Farnworth et al. ...... 257/296 |
| 6,891,227 B2 | 5/2005 | Appenzeller et al. |
| 2002/0001905 A1 | 1/2002 | Choi et al. |
| 2002/0163079 A1 | 11/2002 | Awano |
| 2003/0132461 A1* | 7/2003 | Roesner et al. .......... 257/213 |
| 2003/0168683 A1 | 9/2003 | Farnworth et al. |
| 2003/0170930 A1 | 9/2003 | Choi et al. |

(Continued)

FOREIGN PATENT DOCUMENTS

EP    1 331 671 A1    7/2003

(Continued)

OTHER PUBLICATIONS

G. S. Duesberg et al., "Large-Scale Integration of Carbon Nanotubes Into Silicon Based Microelectronics," Proceedings of the SPIE, Bellingham, VA, vol. 5118, May 21, 2003.

(Continued)

*Primary Examiner*—Phat X. Cao
(74) *Attorney, Agent, or Firm*—Wood, Herron & Evans, LLP

(57) ABSTRACT

Vertical field effect transistors having a channel region defined by at least one semiconducting nanotube and methods for fabricating such vertical field effect transistors by chemical vapor deposition using a spacer-defined channel. Each nanotube is grown by chemical vapor deposition catalyzed by a catalyst pad positioned at the base of a high-aspect-ratio passage defined between a spacer and a gate electrode. Each nanotube grows in the passage with a vertical orientation constrained by the confining presence of the spacer. A gap may be provided in the base of the spacer remote from the mouth of the passage. Reactants flowing through the gap to the catalyst pad participate in nanotube growth.

24 Claims, 13 Drawing Sheets

U.S. PATENT DOCUMENTS

| | | |
|---|---|---|
| 2003/0178617 A1 | 9/2003 | Appenzeller et al. |
| 2003/0227015 A1 | 12/2003 | Choi et al. |
| 2003/0230760 A1 | 12/2003 | Choi et al. |
| 2005/0056826 A1* | 3/2005 | Appenzeller et al. ......... 257/20 |
| 2005/0129948 A1 | 6/2005 | Furukawa et al. |
| 2005/0130341 A1 | 6/2005 | Furukawa et al. |
| 2005/0167655 A1 | 8/2005 | Furukawa et al. |
| 2005/0167755 A1* | 8/2005 | Dubin et al. ................ 257/368 |
| 2005/0179029 A1 | 8/2005 | Furukawa et al. |

FOREIGN PATENT DOCUMENTS

| | | |
|---|---|---|
| EP | 1 361 608 | 11/2003 |
| EP | 1420414 A | 5/2004 |
| EP | 1 435 660 A2 | 7/2004 |
| WO | 03/0363208 A2 | 7/2003 |
| WO | WO 2004/040616 A | 5/2004 |
| WO | WO 2004/040668 A | 5/2004 |
| WO | WO 2004/105140 A | 12/2004 |

OTHER PUBLICATIONS

Y.Zhao, et al. "Film growth of pillars of multi-walled carbon nanotubes", *J.PHys.: Condens. Matter 15* (2003) L565-L569.

Zhang, et al, "Electric-field-directed growth of aligned single-walled carbon nanotubes", *Applied Physics Letters*, vol. 79, No. 19, Nov. 5, 2001.

http://neep.nasa.gov/index_nasa.cfm/769/#synthesis, *"Synthesis of CNT's"*.

C-H. Kiang, "Growth of Larger-Diameter Single-Walled Carbon Nanotubes", *J.Phys. Chem. A 2000*, 104, 2454-2456.

E.Ploenjes, et al, "Single-Walled Carbon Nanotube Synthesis in CO Laser Pumped Monoxide Plasma". Oct 10, 2001.

Y.Mo, et al, "The growth mechanism of carbon nanotubes from thermal cracking of acetylene over nickel catalyst supported on alumina." *2001 Elsevier Science B.V.*

M.Jung, et al, "Growth of carbon nanotubes by chemical vapor deposition,"*2001 Elsevier Science B.V.*

H.W.Zhu, et al, "Direct Synthesis of Long Single-Walled Carbon Nanotube Strands", May 3, 2002, vol. 296, *Science*.

H.Cui, et al, "Growth behavior of carbon nanotubes on multilayered metal catalyst film on chemical vapor deposition". *Chemical Physics Letters 374* (2003) 222-228.

J.Li, et al, AHighly-ordered carbon nanotube arrays for electronics applications. *Applied Physics Letters*, vol. 75, No. 3, Jul. 19, 1999, pp. 367-369.

Phillip G. Collins, et al., "Engineering Carbon Nanotubes and Nanotube Circuits Using Electrical Breakdown," *Science*, vol. 292, pp. 706-709, Apr. 27, 2001.

V. Derycke, et al., "Carbon Nanotube Inter- and Intra molecular Logic Gates," *Nano Letters*, xxxx vol. 0, No. 0 A-D (Received Aug. 16, 2001).

Phillip G. Collins, et al., "Nanotubes for Electronics," *Scientific American*, pp. 62-69, Dec. 2000.

S.J. Wind et al., *Vertical Scaling of Carbon Nanotube Field-Effect Transistors Using Top Gate Electrodes*, Applied Physics Letters, vol. 80, No. 20, May 20, 2002, pp. 3817-3819.

Z.F.Ren, "Growth, Characterization, and Potential Applications of Periodic Carbon Nanotube Arrays", *Dept of Physics*, Boston College. Updated, 2001.

Jun Li, et al, "Bottom-up approach for carbon nanotube interconnects", *NASA Ames Research Center*, Moffett Field, CA. Rec'd Dec. 5, 2002, accepted Jan. 31, 2003.

Anyuan Cao, et al, "Grapevine-like growth of single walled carbon nanotubes among vertically aligned multiwalled nanotube arrays", *Applied Physics Letters*, vol. 79, No. 9, Aug. 27, 2001, pp. 1252-1254.

*Battelle* No. 12132, "Carbon Nanotube Arrays: Synthesis of Dense Arrays of Well-Aligned Carbon Nanotubes Completely Filled with Titanium Carbide on Titanium Substrates".

Aileen Chang, et al, "Integration of Nanotubes into Devices", *National Nanofabrication Users Network*, p. 58, *Stanford Nanofabrication Facility*, p. 58.

Z.Huang, et al. "Growth of highly oriented carbon nanotubes by plasma-enhanced hot filament chemical vapor deposition". *Applied Physics Letters*, vol. 73, No. 26, Dec. 28, 1998, pp. 3845-3847.

Z.F.Ren, et al, "Synthesis of Large Arrays of Well-Aligned Carbon Nanotubes on Glass", *Science*, vol. 282, Nov. 6, 1998, 1105-1107.

Z.F.Ren, "Large Arrays of Well-Aligned Carbon Nanotubes", *Proceeding of the 13th International Winter School on Electronic Properties of Novel Materials*, p. 263-267, Feb. 27-Mar. 6, 1999, Kirchberg / Tirol, Austria.

Won Bong Choi, et al, "Ultrahigh density nanotransistors by using selectively gr own vertical carbon nanotubes", *Applied Physics Letters*, vol. 79, No. 22, Nov. 26, 2001.

Bo Zheng, et al, "Efficient CVD Growth of Single-Walled Carbon Nanotubes on Surfaces Using Carbon Monoxide Precusor", *Nano Letters*, xxxx vol. 0, No. 0 A-D. American Chemical Society revised Jun. 26, 2002.

Gorman, "Nanoscale Networks: Superlong nanotubes can form a grid", *Science News Online*, May 3, 2003; vol. 163, No. 18.

*"Tiny nanotubes set new record"*, Aug. 7, 2003. Nanotechweb.org.

"IBM Scientists Develop Carbon Nanotube Transistor Technology," IBM.com News—news report concerning work published in *Science*, vol. 292, Issue 5517, Apr. 27, 2001 entitled "Engineering Carbon Nanotubes and Nanotube Circuits Using Electrical Breakdown," by Phaeton Avouris et al..

Ploenjes et al., *Synthesis of single-walled carbon nanotubes in vibrationally non-equilibrium carbon monoxide*, Chemical Physics Letters 352 (2002) pp. 342-247.

P.Harris, "Carbon Nanotubes and related structures", *Cambridge University Press* 1999.

K.Teo, et al, "Catalytic Synthesis of Carbon Nanotubes and Nanofibers", *Encyclopedia of Nanoscience and Nanotechnology*, vol. X, pp. 1-22, 2003.

G.S. Duesberg et al., Ways Towards the Scaleable Integration of Carbon Nanotubes into Silicon Based Technology, Diamond and Related Materials; Elsevier Science Publishers; Amsterdam, NL; vol. 13, No. 2; Feb. 1, 2004; pp. 354-361; XP004492567.

V.N. Popov, Carbon Nanotubes: Properties and Application, Materials Science and Engineering, R. vol. R43, No. 3, pp. 61-102 (Jan. 14, 2004) (Summary Only).

* cited by examiner

VERTICAL FIELD EFFECT TRANSISTORS INCORPORATING SEMICONDUCTING NANOTUBES GROWN IN A SPACER-DEFINED PASSAGE

FIELD OF THE INVENTION

The invention relates to semiconductor device fabrication and, more particularly, to vertical field effect transistors incorporating semiconducting nanotubes as a channel region and methods of fabricating such vertical field effect transistors.

BACKGROUND OF THE INVENTION

Traditional field effect transistors (FET's) are familiar conventional devices commonly incorporated as a fundamental building block into the intricate circuitry of integrated circuit (IC) chips. A single IC chip may feature many thousands to millions of FET'S, along with other passive components such as resistors and capacitors, interconnected by conductive paths. FET's operate by varying the resistivity of a channel in a channel region separating a source and a drain. Carriers flow from the source to the drain through the channel in proportion to the variation in electrical resistivity. Electrons are responsible for channel conduction in n-channel FET's and, in p-channel FET's, holes are responsible for conduction in the channel. The output current of the FET is varied by application of a voltage to an electrostatically-coupled gate electrode located above the channel region between the source and drain. A thin gate dielectric insulates the gate electrode electrically from the channel region. A small change in gate voltage can cause a large variation in the current flowing from the source to the drain.

FET's can be classified into horizontal architectures and vertical architectures. Horizontal FET's exhibit carrier flow from source to drain in a direction parallel to the horizontal plane of the substrate on which they are formed. Vertical FET's exhibit carrier flow from source to drain in a direction vertical to the horizontal plane of the substrate on which they are formed. Because channel length for vertical FET's does not depend on the smallest feature size resolvable by lithographic equipment and methods, vertical FET's can be made with a shorter channel length than horizontal FET's. Consequently, vertical FET's can switch faster and possess a higher power handling capacity than horizontal FET's.

Carbon nanotubes are nanoscale high-aspect-ratio cylinders consisting of hexagonal rings of carbon atoms that have been proposed for use in forming hybrid devices, such as FET's. Carbon nanotubes efficiently conduct in their conducting form and act as a semiconductor in their semiconductor form. Horizontal FET's have been fabricated using a single semiconducting carbon nanotube as a channel region and forming ohmic contacts at opposite ends of the carbon nanotube extending between a gold source electrode and a gold drain electrode situated on the surface of a substrate. A gate electrode is defined in the substrate underlying the carbon nanotube and generally between the source and drain electrodes. The exposed surface of the substrate is oxidized to define a gate dielectric between the buried gate electrode and the carbon nanotube. Such horizontal FET's should switch reliably while consuming significantly less power than a comparable silicon-based device structure due to the small dimensions of the carbon nanotube. Although successfully formed under laboratory conditions by manipulating single carbon nanotubes using an atomic force microscope, these horizontal FET device structures are incompatible with mass production techniques.

What is needed, therefore, is a vertical FET structure incorporating one or more semiconducting carbon nanotubes as a channel region that is compliant with mass production techniques for IC chips.

SUMMARY OF THE INVENTION

In accordance with the principles of the invention, a vertical semiconductor device structure is provided that includes a substrate defining a substantially horizontal plane, a gate electrode projecting vertically from the substrate and including a vertical sidewall, and a spacer flanking the vertical sidewall. Positioned between the gate electrode and the spacer is a semiconducting nanotube extending between opposite first and second ends with a substantially vertical orientation. Disposed on the vertical sidewall between the carbon nanotube and the gate electrode is a gate dielectric. The first end of the semiconducting nanotube is electrically coupled with a source and the opposite second end of the semiconducting nanotube is electrically coupled with a drain.

In another aspect, a method for fabricating a semiconductor device structure includes forming a catalyst pad on a substrate and forming a gate electrode adjacent to the catalyst pad. A first spacer is formed on a vertical sidewall of the gate electrode at a position overlying the catalyst pad and a second spacer is formed on the first spacer. The first spacer is removed to define a passage or open space bounded between the second spacer and the gate electrode in which the passage has an open mouth at one end and the catalyst pad situated at the opposite end. A gate dielectric is formed on the vertical sidewall of the gate electrode. The method further includes synthesizing a semiconducting nanotube on the catalyst pad that extends substantially vertically from the catalyst pad to a free end proximate the open mouth of the passage.

Consistent with the principles of the invention, nanotube growth is constrained to a well-defined vertical growth direction inside a high-aspect ratio open space or passage defined by a spacer adjacent to the gate electrode. As a result, the conventional difficulty associated with the isotropic directional growth of nanotubes is eliminated. A gap may be provided in the spacer that permits efficient and effective introduction of the reactant or reactants required to grow the carbon nanotubes into the passage in the vicinity of the interface region between the catalyst material and each growing nanotube. The length of the channel region between the source and drain is defined by the vertical dimension or thickness of the gate electrode without the limitations imposed by conventional lithographic processes used in semiconductor device fabrication. As a result, the length of the channel region may have a feature size that is smaller than feature sizes produced by standard lithographic and etch processes.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF SPECIFIC EMBODIMENTS

The invention is directed to vertical field effect transistors (FET's) that utilize carbon nanotubes as a semiconducting material for the channel region providing a selective conduction path between a source and a drain. In accordance with the principles of the invention, the carbon nanotubes are grown in a confined vertical open space or passage such that isotropic growth is prevented. As a result, the carbon nanotubes are substantially vertically oriented and situated in a desired location adjacent to a gate electrode to which voltage is applied for controlling the current flowing from the source to the drain. The length of the channel region between the source and drain is defined by the thickness of the gate electrode, which is substantially equal to the nanotube length, and is not dependent upon a lithographic process. The nanotube growth rate is enhanced by providing an additional flow pathway for gaseous or vaporized reactants to a catalytic material residing at the base of the passage that facilitates nanotube growth. As a result, the sole path to the catalyst material is not in a vertical direction from the entrance to the base of a high-aspect-ratio passage.

Figure 1A:
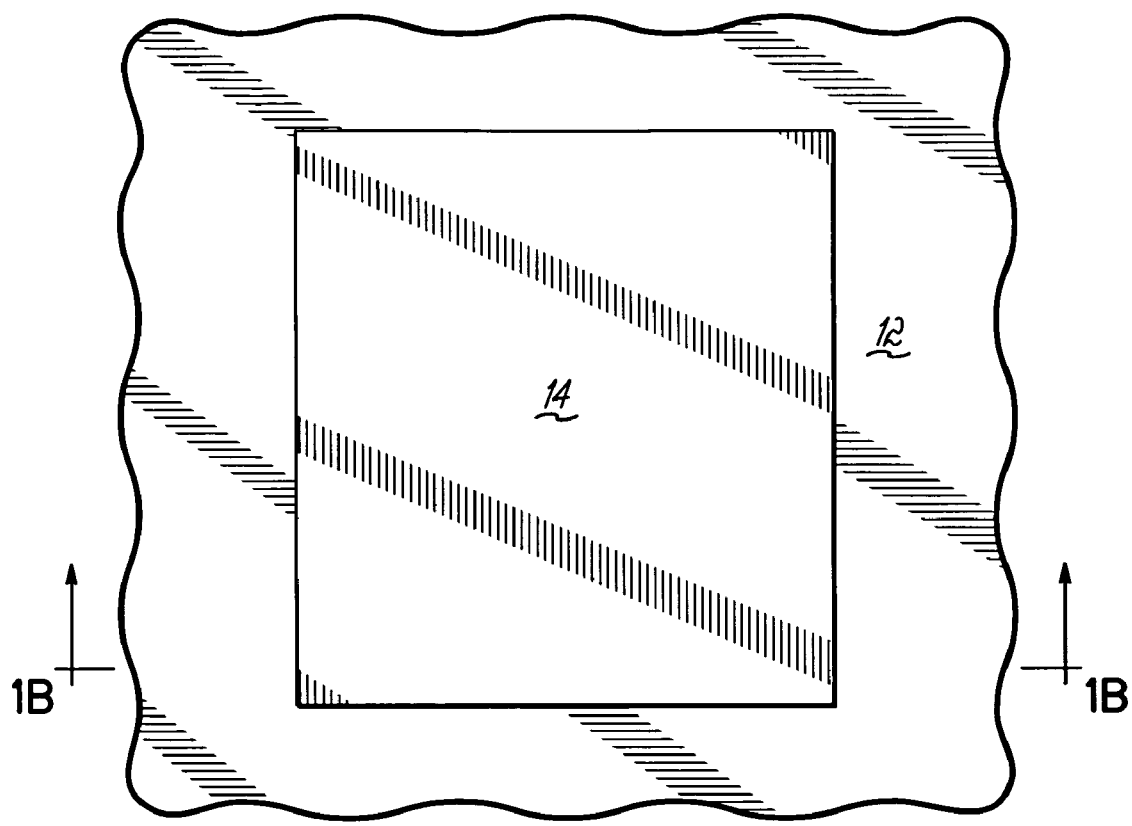
FIG. 1A is a top view of a portion of a substrate.
Figure 1B:
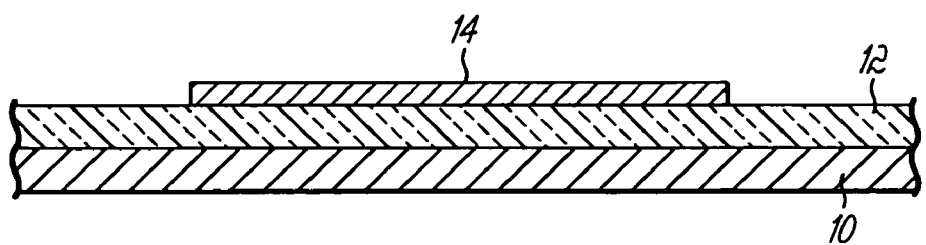
FIG. 1B is a cross-sectional view taken generally along lines 1B—1B in FIG. 1A.

With reference to FIGS. 1A and 1B, a region of a substrate 10 is covered by a planar insulating layer 12 characterized by a high electrical resistivity relative to the underlying substrate 10. Substrate 10 may be any suitable semiconductor substrate material, including but not limited to silicon (Si) and gallium arsenide (GaAs), upon which an insulating layer, such as insulating layer 12, may be formed. Insulating layer 12 may be composed of, for example, silicon oxide ($SiO_2$) or silicon nitride ($Si_3N_4$).

A catalyst pad 14 of a catalytic material suitable for supporting the growth of carbon nanotubes are formed on the insulating layer 12 by depositing a blanket layer of the catalytic material on the insulating layer 12 and employing a standard lithographic and subtractive etch process to pattern the blanket layer. The blanket layer of catalytic material patterned to form catalyst pad 14 may be deposited by any conventional deposition technique, including but not limited to chemical vapor deposition (CVD) by thermal decomposition/thermolysis of a metal-containing precursor such as metal halides and metal carbonyls, sputtering, and physical vapor deposition (PVD). The catalytic material in catalyst pad 14 may be any material capable of nucleating and supporting the growth of carbon nanotubes when exposed to suitable reactants under reaction conditions suitable to promote nanotube growth. For example, suitable catalytic materials include, but are not limited to, iron, platinum, nickel, cobalt, and compounds such as silicides of each of these metals.

The invention contemplates that the insulating layer 12 may be omitted and that, in the alternative, substrate 10 may include shallow-trench-isolation (STI) structures or local-oxidation-of-silicon (LOCOS) structures that electrically isolate the region of substrate 10 depicted in FIGS. 1A, 1B from adjacent regions of substrate 10, which may also incorporate additional device structures as described herein or other device structures. In this alternative embodiment, the catalyst pad 14 is formed or deposited by a conventional process in pad-shaped trenches in a region of substrate 10 isolated by the STI or LOCOS structures. The invention contemplates that multiple catalyst pads 14 may be provided on the insulating layer 12 consistent with mass fabrication techniques.

Figure 2A:
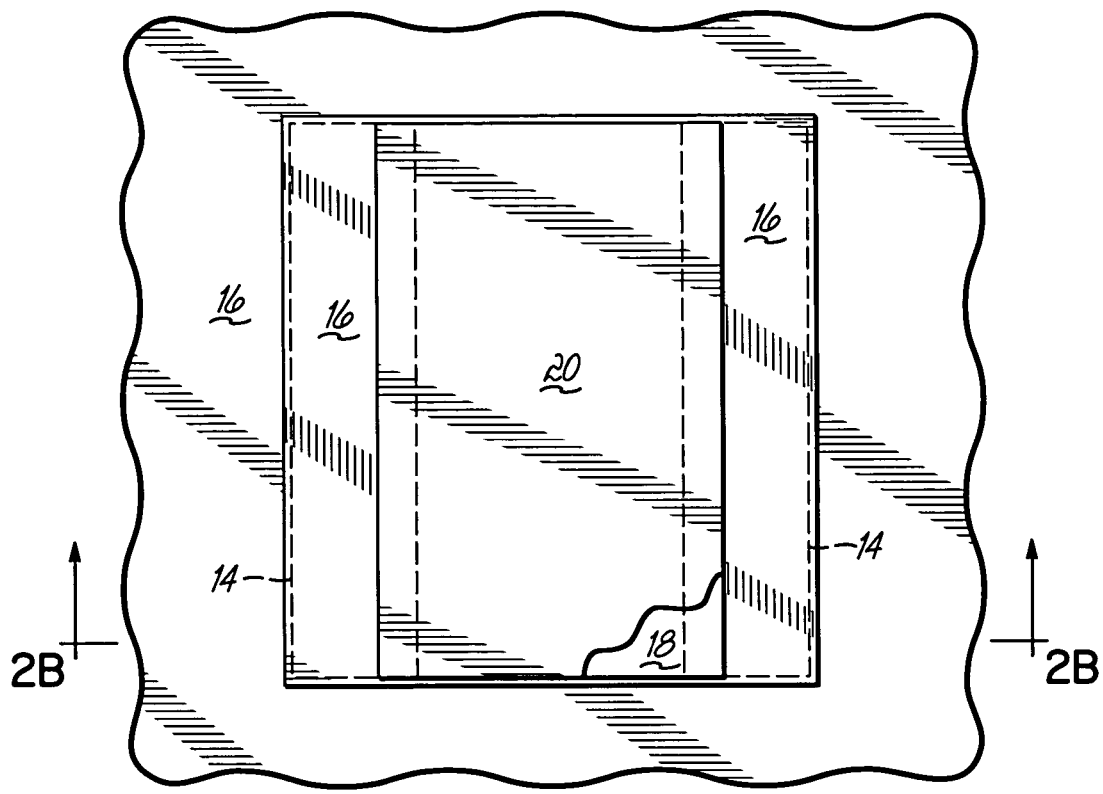
FIG. 2A is a top view similar to FIG. 1A at a subsequent fabrication stage.
Figure 2B:
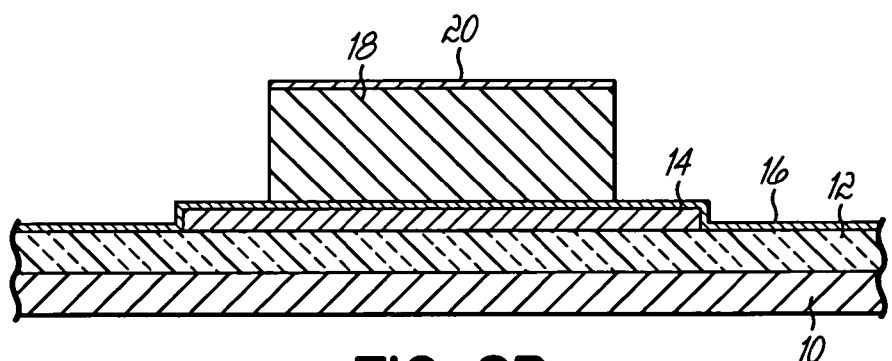
FIG. 2B is a cross-sectional view taken generally along lines 2B—2B in FIG. 2A.

With reference to FIGS. 2A and 2B, a thin insulating layer 16 is conformally deposited over the insulating layer 12 and catalyst pad 14. Insulating layer 16 is formed of a dielectric material such as $SiO_2$ or $Si_3N_4$, which may be deposited by CVD by thermal decomposition/thermolysis of a silicon-containing precursor or low pressure chemical vapor deposition (LPCVD) or, alternatively, grown in the instance of oxide by thermal oxidation. A pillar 18 of a conductive material is formed on the insulating layer 16 overlying the catalyst pad 14. A hardmask 20 of an insulating material is applied to the exposed upper surface of the pillar 18.

The pillar 18 and the hardmask 20 overlying the pillar 18 are formed by a standard lithographic and etch process that initially deposits a blanket layer of a conductive material, such as highly-doped polycrystalline silicon (polysilicon) deposited by LPCVD, on the insulating layer 16 and then deposits a layer of an insulating material, such as $SiO_2$ or, more specifically, tetraethylorthosilicate-based (TEOSbased) $SiO_2$, on the blanket layer of conductive material. The insulating material is patterned to expose unmasked areas of the blanket layer of conductive material and masked areas aligned with the catalyst pad 14, as explained below, and then etched using, for example, a reactive ion etching (RIE) process that is selective to the insulating material of the hardmask 20, to remove the conductive material in the unmasked areas.

References herein to terms such as "vertical", "horizontal", etc. are made by way of example, and not by way of limitation, to establish a frame of reference. The term "horizontal" as used herein is defined as a plane parallel to the conventional plane or surface of substrate 10, regardless of orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood various other frames of reference may be employed without departing from the spirit and scope of the invention.

Figure 3A:
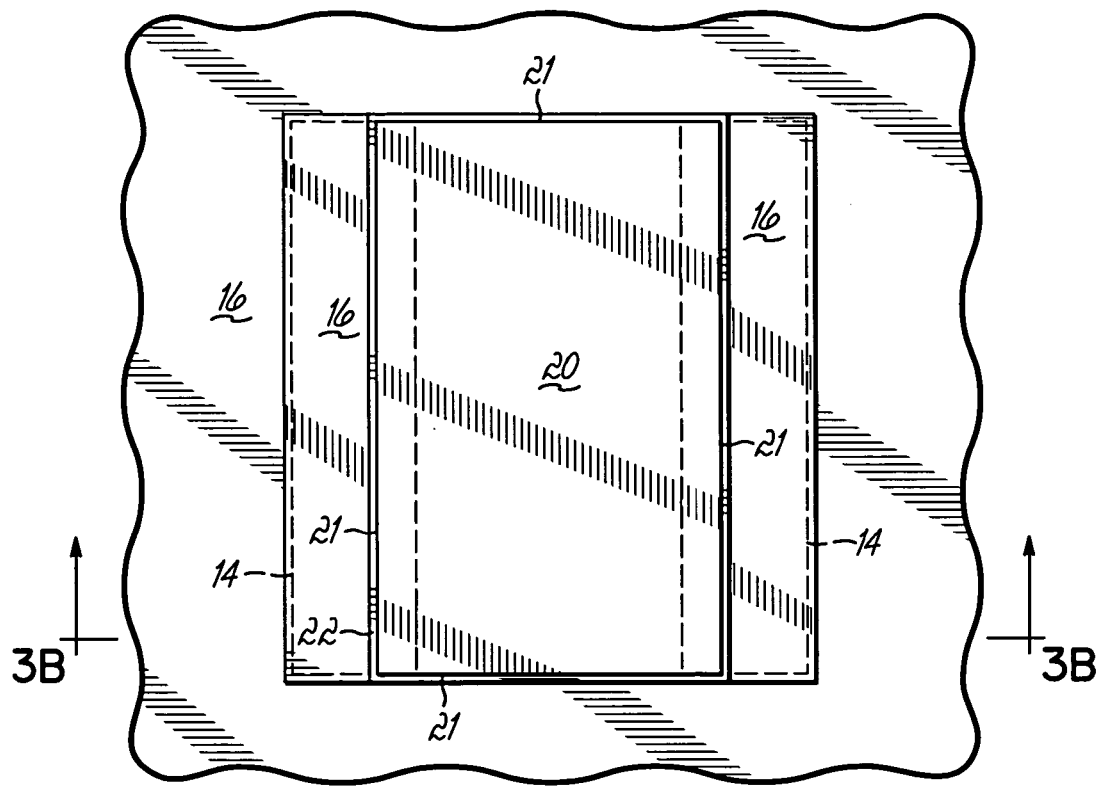
FIG. 3A is a top view similar to FIG. 2A at a subsequent fabrication stage.
Figure 3B:
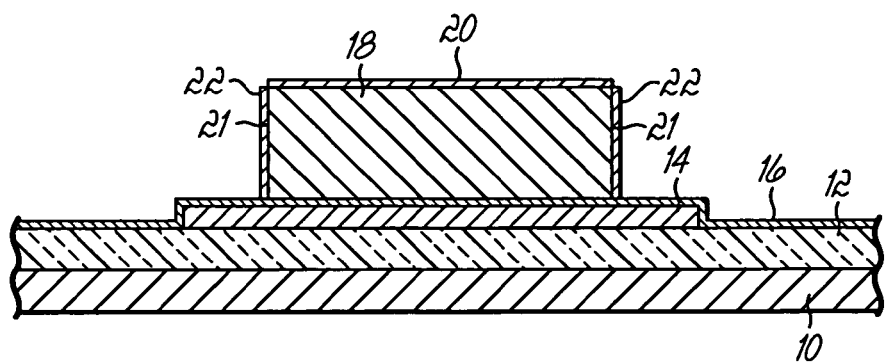
FIG. 3B is a cross-sectional view taken generally along lines 3B—3B in FIG. 3A.

With reference to FIGS. 3A and 3B, a spacer 22 of a temporary spacer material is formed about a vertical sidewall 21 of the pillar 18 by conformally depositing a thin film of a spacer material and etching anisotropically with, for example, a RIE process selective to the material forming insulating layer 12 and hardmask 20. The spacer material constituting spacer 22 may be, for example, $SiO_2$ or $Si_3N_4$. Spacer 22 is sacrificial in that spacer 22 is completely removed during subsequent processing. In an exemplary embodiment of the invention, the insulating layer 12 and the hardmask 20 are composed of $SiO_2$ and the spacer 22 is composed of $Si_3N_4$ so that the RIE removing the spacer 22 is selective to the material forming insulating layer 12 and hardmask 20. The spacer 22 projects horizontally outward from the sidewall 21.

Figure 4A:
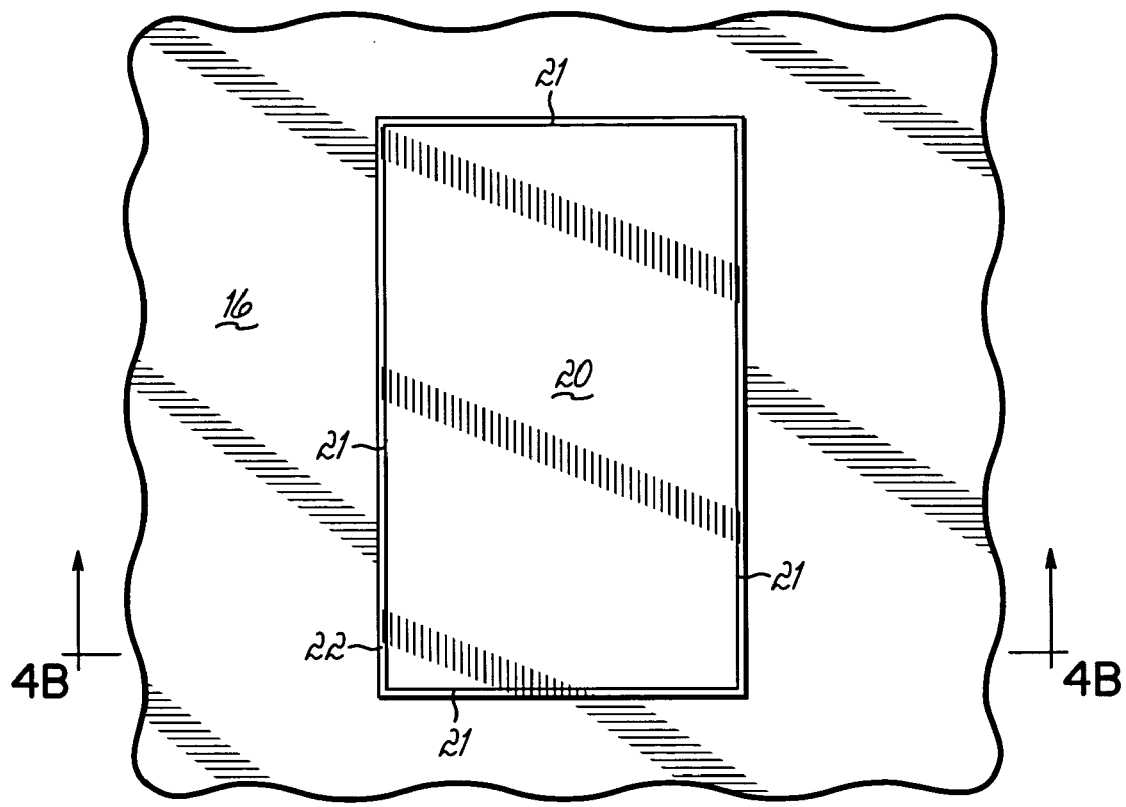
FIG. 4A is a top view similar to FIG. 3A at a subsequent fabrication stage.
Figure 4B:
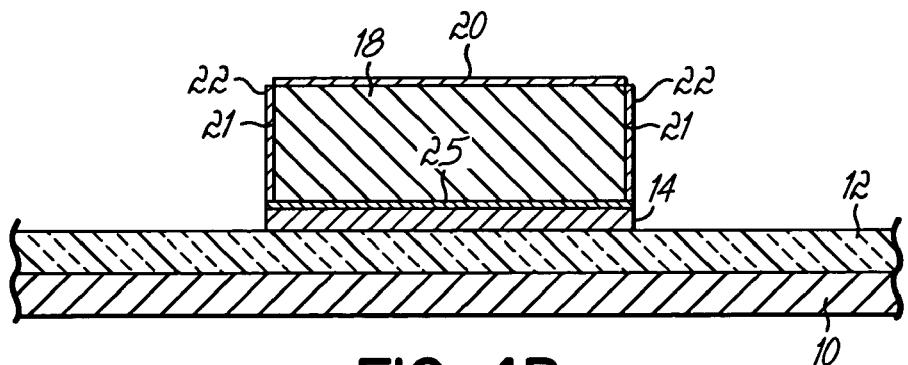
FIG. 4B is a cross-sectional view taken generally along lines 4B—4B in FIG. 4A.

With reference to FIGS. 4A and 4B, the catalyst pad 14 is reduced in size by trimming the area of edge portions extending from beneath the pillar 18. To that end, areas of the insulating layer 16 not masked by the pillar 18 and spacer 22 are removed by etching, which may be a distinct etching process from the etching process defining spacer 22 or a continued etch process in which the etching conditions are changed appropriately for etching the insulating layer 16. Then, areas of catalyst pad 14 not masked by the pillar 18 and spacer 22 are removed by etching to reduce the exposed surface area of catalyst pad 14, which again may be a distinct etching process from the etching processes removing the areas of the insulating layer 16 or a continued etch process in which the etching conditions are changed appropriately for etching the catalyst material. Catalyst pad 14 is covered by a layer 25 of insulating material that is a remnant of insulating layer 16.

Figure 5A:
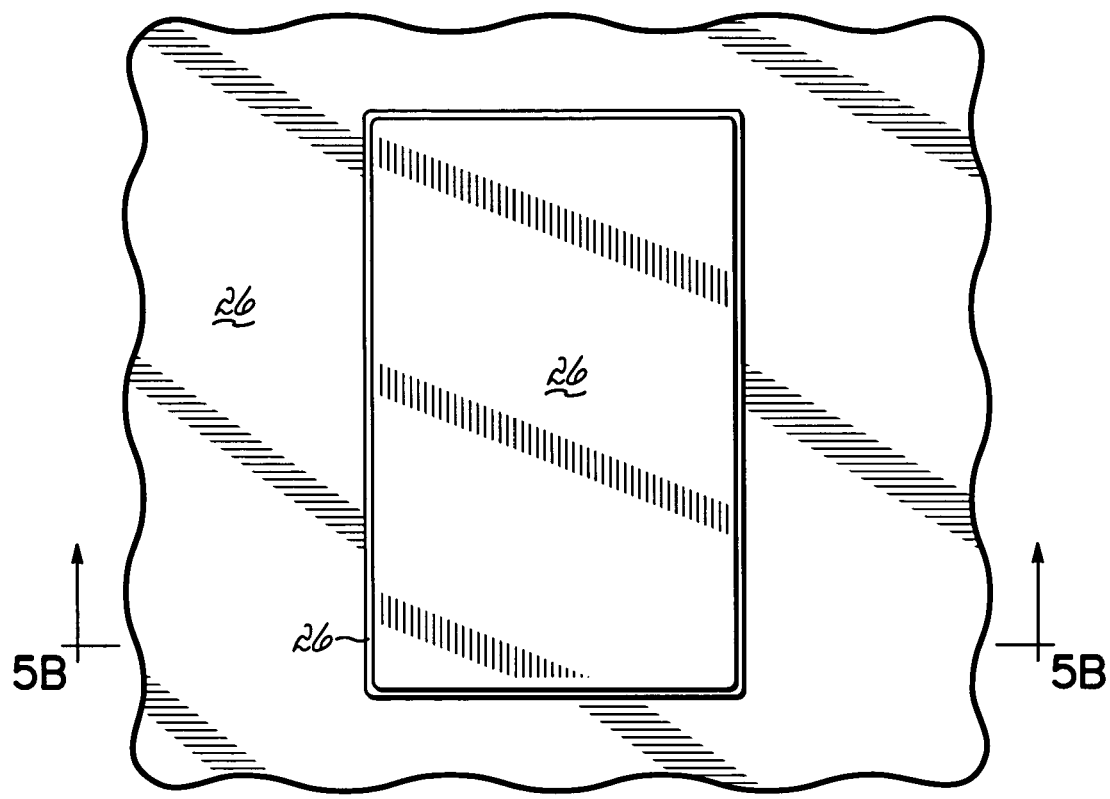
FIG. 5A is a top view similar to FIG. 4A at a subsequent fabrication stage.
Figure 5B:
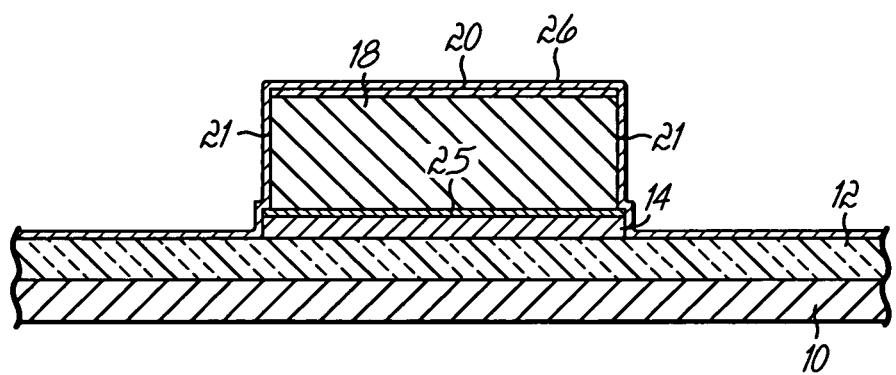
FIG. 5B is a cross-sectional view taken generally along lines 5B—5B in FIG. 5A.

With reference to FIGS. 5A and 5B, spacer 22 is removed from the sidewall 21 of the pillar 18 by any wet or dry etch process that is selective to the constituent materials of the substrate 10, the hardmask 20 and the catalyst pad 14. A blanket layer 26 of a suitable spacer material, such as $SiO_2$ or germanium (Ge), is conformally deposited by a CVD or LPCVD process on substrate 10. Portions of blanket layer 26 covering the sidewall 21 of pillar 18 will be formed into spacers 30, as explained below, having approximately the same thickness as spacer 22.

Figure 6A:
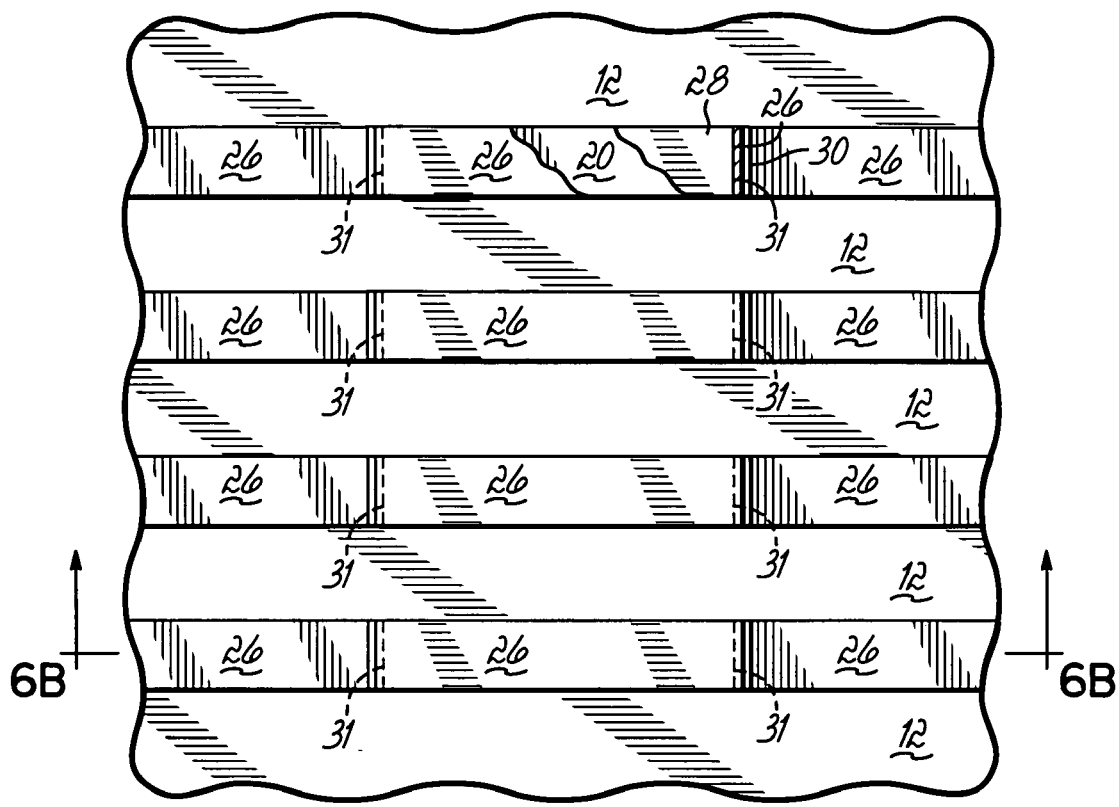
FIG. 6A is a top view similar to FIG. 5A at a subsequent fabrication stage.
Figure 6B:
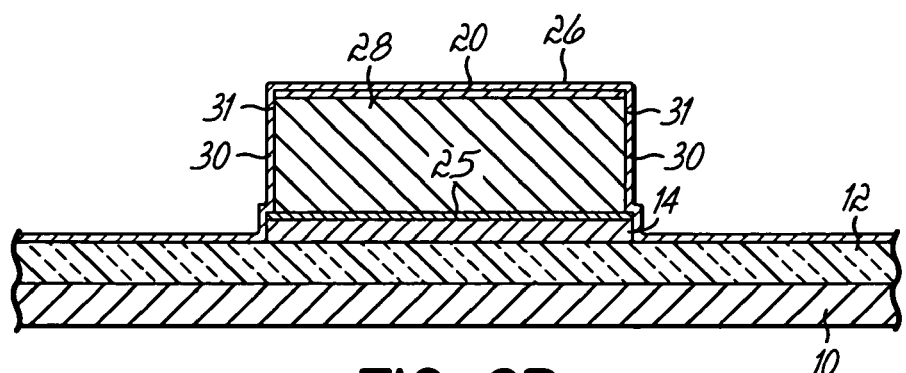
FIG. 6B is a cross-sectional view taken generally along lines 6B—6B in FIG. 6A.

With reference to FIGS. 6A and 6B, vertically-aligned portions of the blanket layer 26, the hardmask 20, the pillar 18 and the catalyst pad 14 are removed using a standard lithographic and subtractive etch process intended to divide or partition the pillar 18 into multiple gate electrodes 28. To that end, a resist layer (not shown) is applied to the blanket layer 26, exposed to impart a latent image pattern, and developed to transform the latent image pattern into a final image pattern having masked areas in the form of parallel strips that cover blanket layer 26 at the future locations of gate electrodes 28. After the conclusion of the etch process, areas of insulating layer 12 are uncovered between the gate electrodes 28. Preferably, the feature size of the gate electrodes 28 is at, or near, minimum lithographic dimensions. Spacers 30 are defined as a portion of the patterned blanket layer 26 extending vertically up a sidewall 31 of each gate electrode 28 above the location of the catalyst pads 24. Spacers 30 are sacrificial as they are completely removed during subsequent processing.

Figure 7A:
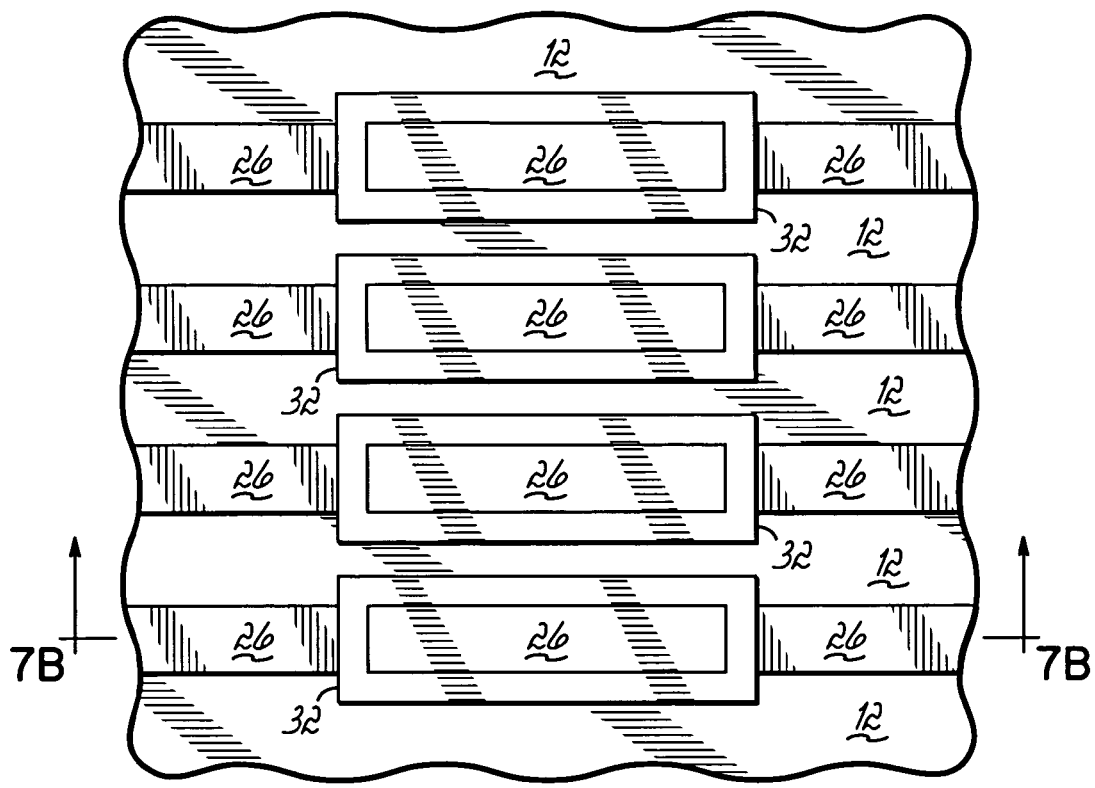
FIG. 7A is a top view similar to FIG. 6A at a subsequent fabrication stage.
Figure 7B:
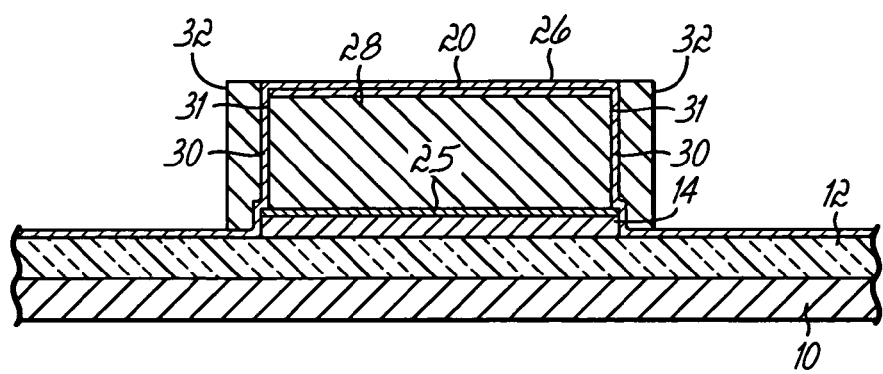
FIG. 7B is a cross-sectional view taken generally along lines 7B—7B in FIG. 7A.

With reference to FIGS. 7A and 7B, a spacer 32 of a suitable permanent spacer material, such as $Si_3N_4$, is formed about the sidewall 31 of each gate electrode 28. Portions of spacer 32 overlap and cover each of spacers 30. The material forming spacer 32 is permanent in the sense that spacer 32 is incorporated into the completed device structure, in contrast to spacers 30. Spacer 32 is formed by conformally depositing a blanket layer of the permanent spacer material on substrate 10 and anisotropically etching the blanket layer by, for example, a RIE process selective to the material forming insulating layer 12 and hardmask 20 so that, following the etch process, the spacer 32 on each gate electrode 28 represents the only residual portions of the blanket layer of permanent spacer material. The permanent spacer material constituting spacer 32 may be, for example, $Si_3N_4$ or $SiO_2$ if the material constituting spacers 30 is Ge. Spacer 32 is separated from the sidewall 31 of each gate electrode 28 by spacers 30 on the two opposite sides overlying the side edges of catalyst pad 14 and is attached to the other two opposite sides of each gate electrode 28.

Figure 8A:
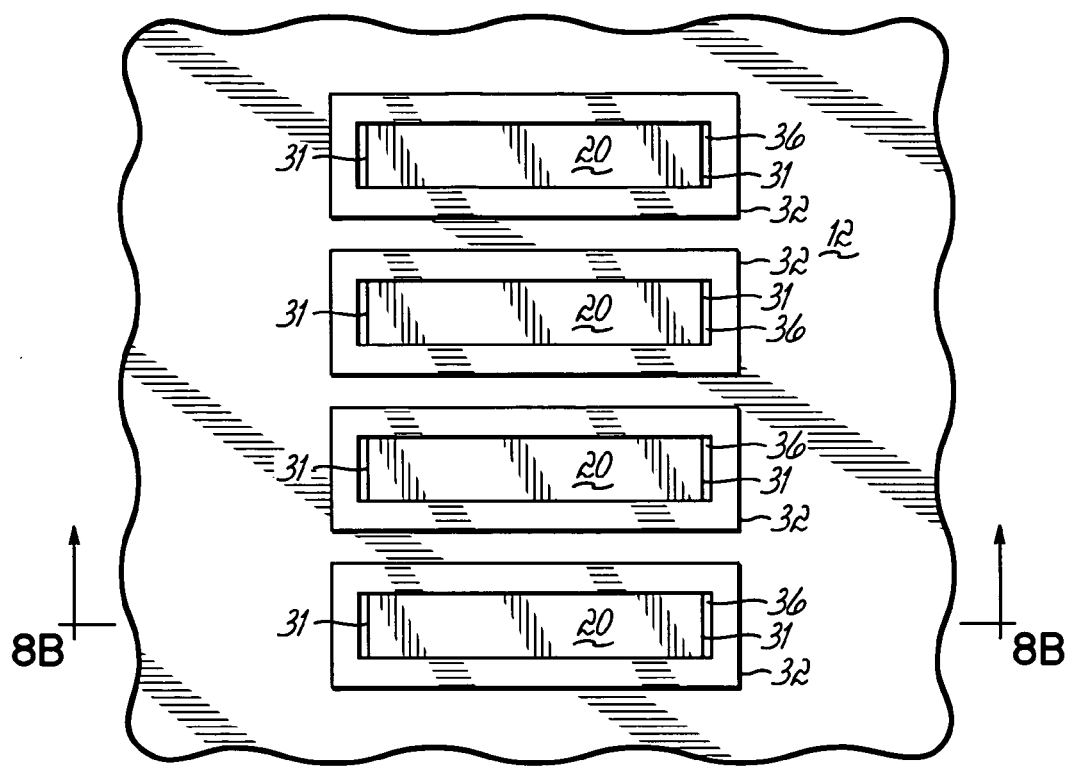
FIG. 8A is a top view similar to FIG. 7A at a subsequent fabrication stage.
Figure 8B:
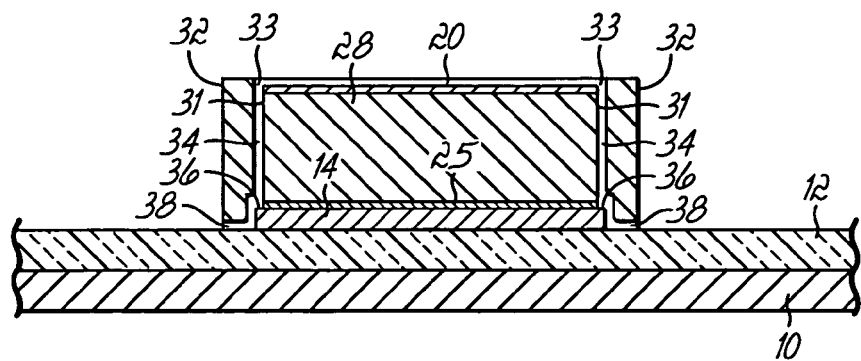
FIG. 8B is a cross-sectional view taken generally along lines 8B—8B in FIG. 8A.

With reference to FIGS. 8A and 8B, spacers 30 on each gate electrode 28 are removed by an isotropic etch process selective to the materials forming hardmask 20 and spacer 32. For example, if spacers 30 are formed of Ge and spacer 32 is formed of either $Si_3N_4$ or $SiO_2$, an aqueous etchant solution containing hydrogen peroxide ($H_2O_2$) would be appropriate for removing spacers 30 selective to the hardmask 20 and spacer 32. The spacer 32 and gate electrode 28 are spaced apart by open spaces or passages 34 created by the isotropic etch process in the space formerly occupied by spacers 30. Each of the passages 34 has a substantially rectangular cross-sectional profile when viewed in a vertical direction. The isotropic etch process also removes the remaining portions of patterned blanket layer 26 to re-expose the insulating layer 12.

A portion of layer 25 exposed by the formation of passages 34 is removed from the side edges of catalyst pad 14 to expose or uncover corresponding nanotube synthesis areas 36. A gap 38 formerly filled by a portion of one of spacers 30 is present beneath each spacer 32 adjacent to the corresponding nanotube synthesis areas 36 and vertically between spacer 32 and insulating layer 12. Each passage 34 extends vertically from one of the catalyst pad 14 to an open mouth 33 situated adjacent to the hardmask 20. The nanotube synthesis areas 36 are positioned vertically below a corresponding one of the open mouths 33.

Figure 9A:
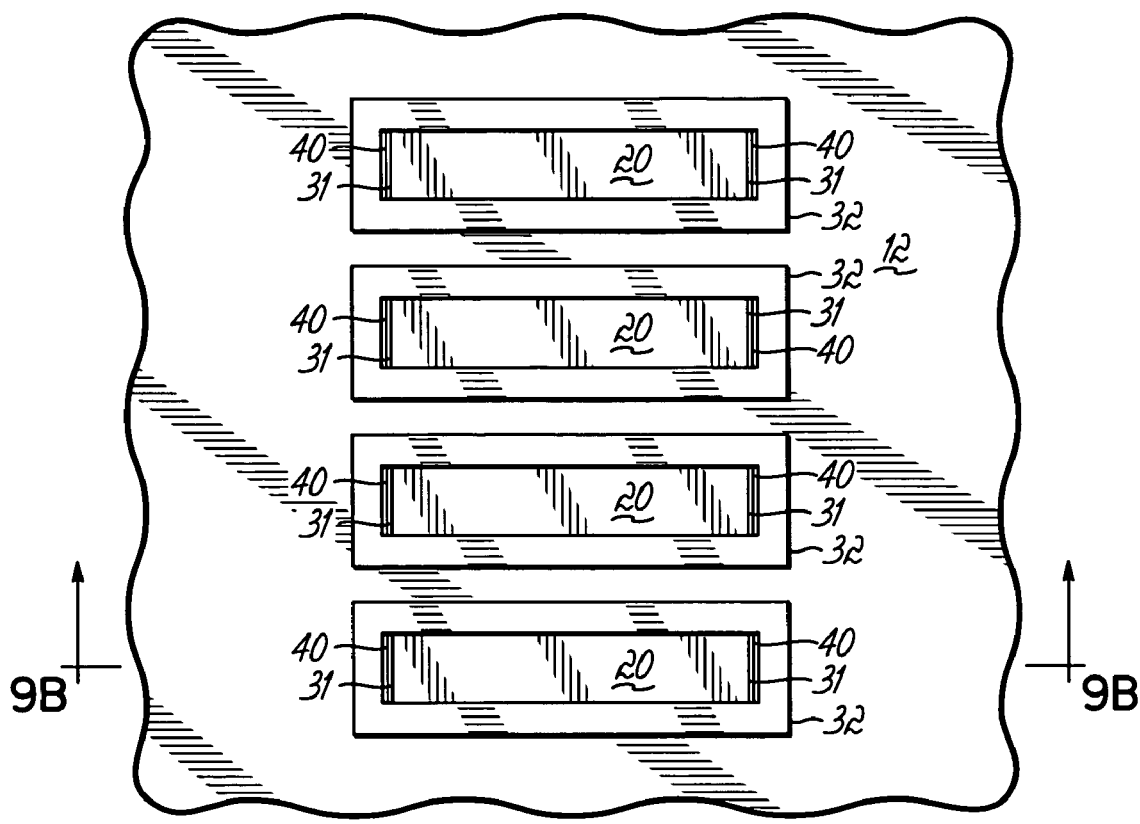
FIG. 9A is a top view similar to FIG. 8A at a subsequent fabrication stage.
Figure 9B:
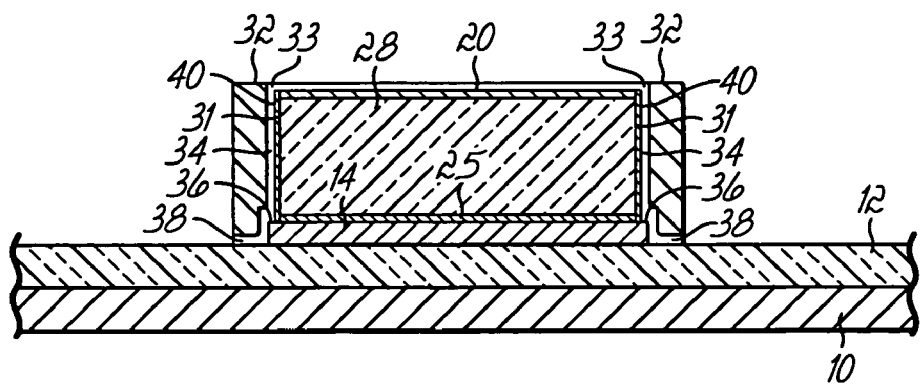
FIG. 9B is a cross-sectional view taken generally along lines 9B—9B in FIG. 9A.

With reference to FIGS. 9A and 9B, a layer 40 of an insulating material, such as $SiO_2$, is then applied to the exposed portions of the sidewall 31 of each gate electrode 28 coextensive with passages 34 for electrically isolating each gate electrode 28 from the corresponding passage 34. The process forming layer 40 is selected such that the exposed material of nanotube synthesis areas 36 is not coated or otherwise modified in a manner that may cause the growth of carbon nanotubes to not be supported. For example, the partial pressure of oxygen in a wet oxidation process forming layer 40 may be adjusted such that $SiO_2$ grows on the exposed portions of sidewall 31 and an oxide does not form on the nanotube synthesis areas 36. The horizontal dimensions of each passage 34, which is reduced by the presence of layer 40, are adequate to allow vertical growth of carbon nanotubes, as described hereinafter, and are otherwise substantially determined by the dimensions of spacers 30.

Figure 10A:
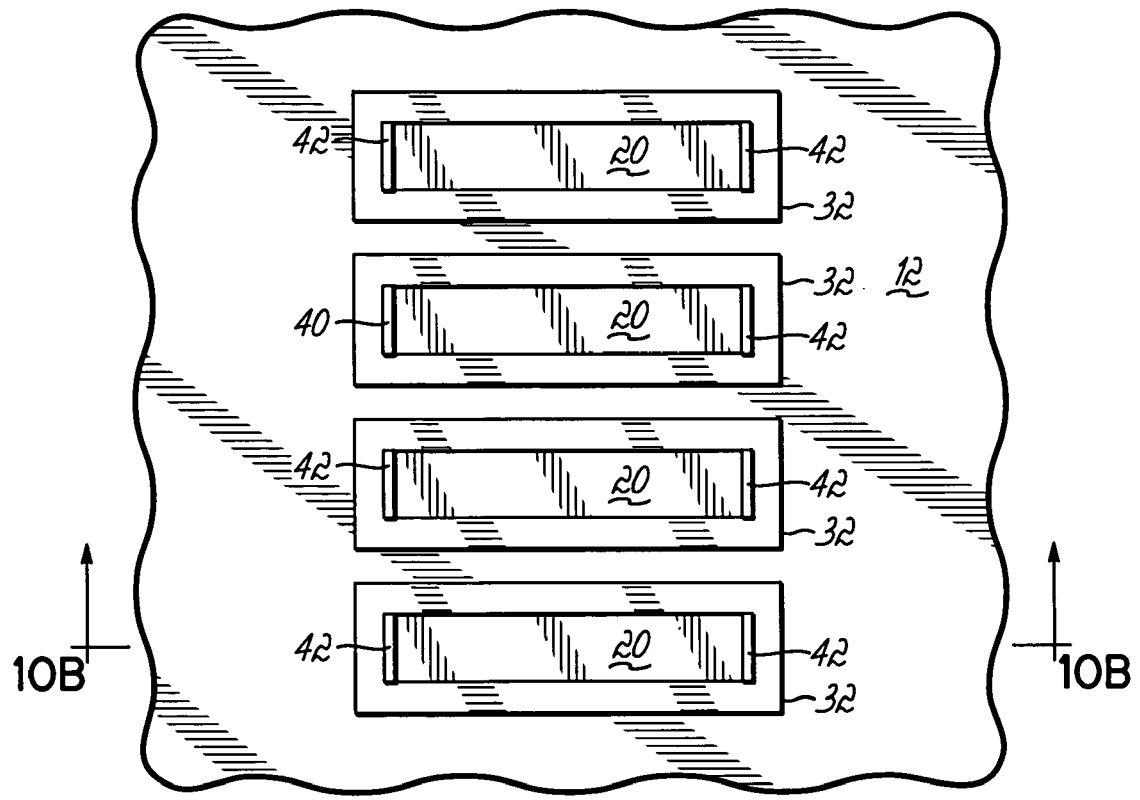
FIG. 10A is a top view similar to FIG. 9A at a subsequent fabrication stage.
Figure 10B:
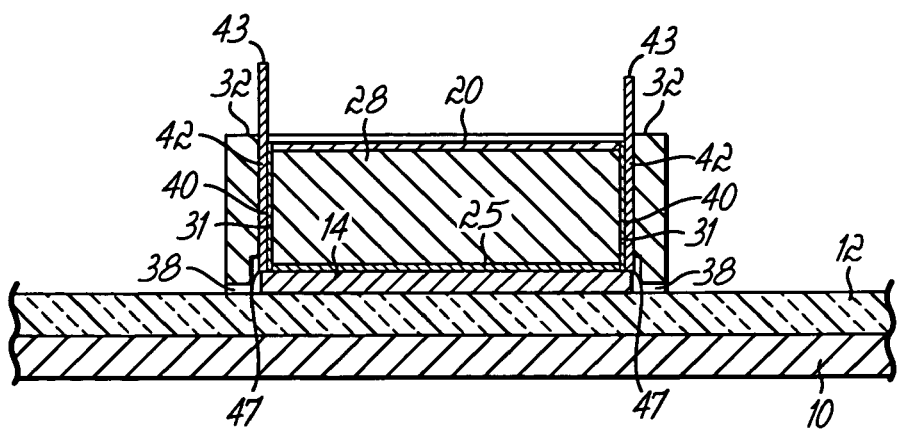
FIG. 10B is a cross-sectional view taken generally along lines 10B—10B in FIG. 10A.

With reference to FIGS. 10A and 10B, a bundle or group of carbon nanotubes 42 is provided in the passages 34, which are adjacent to the portions of the sidewall 31 of each gate electrode 28 covered by layer 40. The carbon nanotubes 42 are hollow cylindrical tubes composed of arranged hexagonal rings of carbon atoms and, typically, are parameterized by a diameter of about 0.5 nm to about 20 nm and a sidewall thickness ranging from about 5 nm to about 50 nm. The carbon nanotubes 42 are expected to have a distribution of heights or lengths each measured between a leading end or tip 43 and a trailing end or base 47 opposite to the leading tip 43 that is atop one of the nanotube synthesis areas 36. The length distribution of carbon nanotubes 42 may be characterized by an average length and a standard deviation. At least one of the carbon nanotubes 42 in each passage 34 projects vertically above the horizontal plane defined by the hardmask 20 covering each gate electrode 28.

The carbon nanotubes 42 extend substantially vertically upward from the nanotube synthesis areas 36 and occupy a volume fraction of the empty space inside the passages 34 of each gate electrode 28. Each of the carbon nanotubes 42 is oriented perpendicular or, at the least, substantially perpendicular to the horizontal upper surface of the corresponding nanotube synthesis areas 36 as the presence of spacer 32 restricts the growth direction of the carbon nanotubes 42. Although minor tilting or inclining of the nanotube orientation is permitted within the confines of the passages 34, isotropic growth is forbidden by spacer 32. For example, carbon nanotubes 42 cannot grow parallel to the horizontal plane of substrate 10.

The carbon nanotubes 42 are grown by chemical vapor deposition (CVD) or plasma-enhanced CVD using any suitable gaseous or vaporized carbonaceous reactant including, but not limited to, carbon monoxide (CO), ethylene ($C_2H_4$), methane ($CH_4$), acetylene ($C_2H_4$), a mixture of acetylene and ammonia ($NH_3$), a mixture of acetylene and nitrogen ($N_2$), a mixture of acetylene and hydrogen ($H_2$), xylene ($C_6H_4(CH_3)_2$), and a mixture of xylene and ferrocene ($Fe(C_5H_5)_2$) under growth conditions suitable for promoting carbon nanotube growth on the catalytic material forming the nanotube synthesis areas 36. The substrate 10 may be heated to promote CVD growth. Initially, the reactant flows laterally through each gap 38 and downwardly through each passage 34 to the catalyst material of nanotube synthesis areas 36. The reactant chemically reacts at the catalyst material of the nanotube synthesis areas 36 to nucleate carbon nanotubes 42. Subsequent vertical growth of the carbon nanotubes 42 may occur from the base on the surface of the nanotube synthesis areas 36 or, alternatively, at the leading free tip 43 of the carbon nanotubes 42 opposite to the base 47. The presence of the gaps 38 enhances the ability of the reactant to reach the nanotube synthesis areas 36 as fluid flow would otherwise be significantly restricted if the reactant were required to only flow downward through passage 34. The invention contemplates that the gaps 38 may omitted if growth occurs from the leading free tip 43 or if fluid flow restrictions are not otherwise present.

Growth conditions of the CVD or plasma-enhanced CVD process are chosen for preferentially growing carbon nanotubes 42 having a semiconducting molecular structure. Alternatively, carbon nanotubes 42 having a semiconducting molecular structure may be preferentially selected from among a collection of as-grown nanotubes 42 including both metallic and semiconducting molecular structures by, for example, applying a current sufficiently high to destroy nanotubes 42 having a metallic molecular structure. In certain embodiments of the invention, a single semiconducting carbon nanotube 42 may be present in one or more of the passages 34. The invention also contemplates that nanotubes 42 may be composed of a material other than carbon characterized by a band gap and semiconducting properties.

Figure 11A:
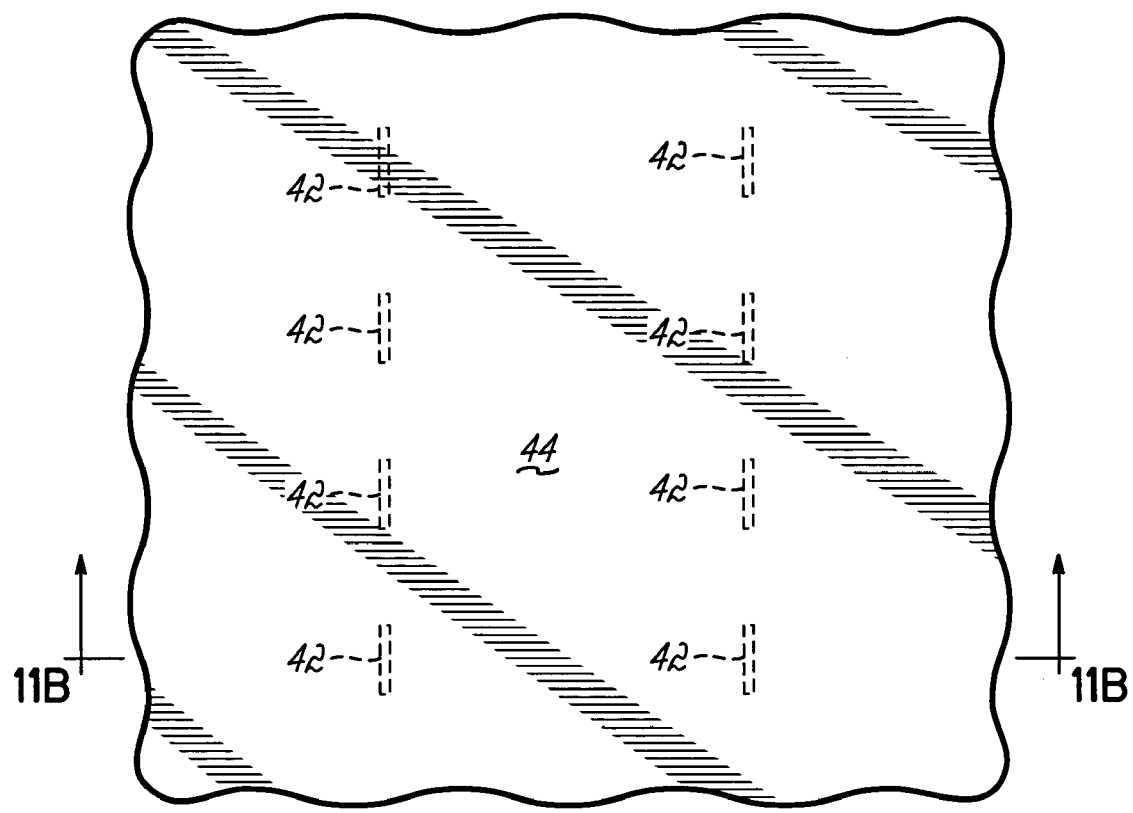
FIG. 11A is a top view similar to FIG. 10A at a subsequent fabrication stage.
Figure 11B:
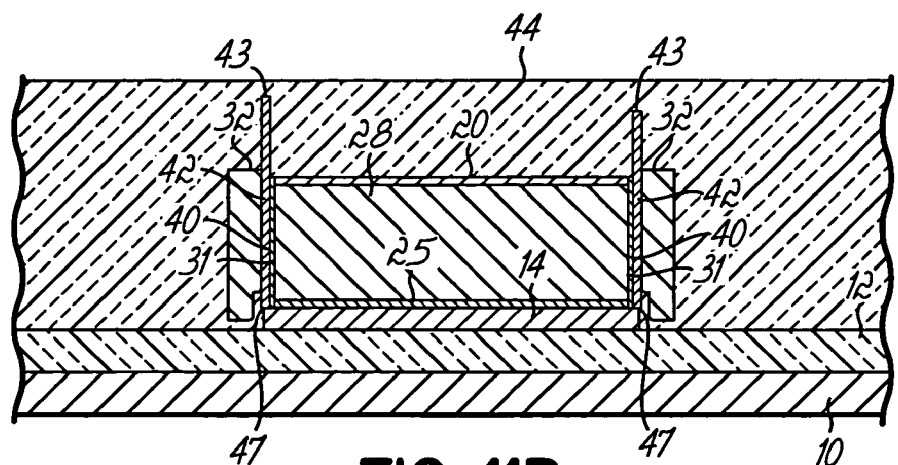
FIG. 11B is a cross-sectional view taken generally along lines 11B—11B in FIG. 11A.

With reference to FIGS. 11A and 11B, a layer 44 of an insulating material of relatively high electrical resistivity, such as borophosphosilicate glass (BPSG), is applied conformally to substrate 10 by a deposition process such as LPCVD. Layer 44 is polished flat by a chemical-mechanical polishing (CMP) process or any other suitable planarization technique. The polishing may remove layer 44 to a depth sufficient to also shorten certain lengthy nanotubes in the distribution of carbon nanotubes 42. Portions of layer 44 may fill any free space between the individual carbon nanotubes 42. Portions of layer 44 also fill each of the gaps 38.

Figure 12A:
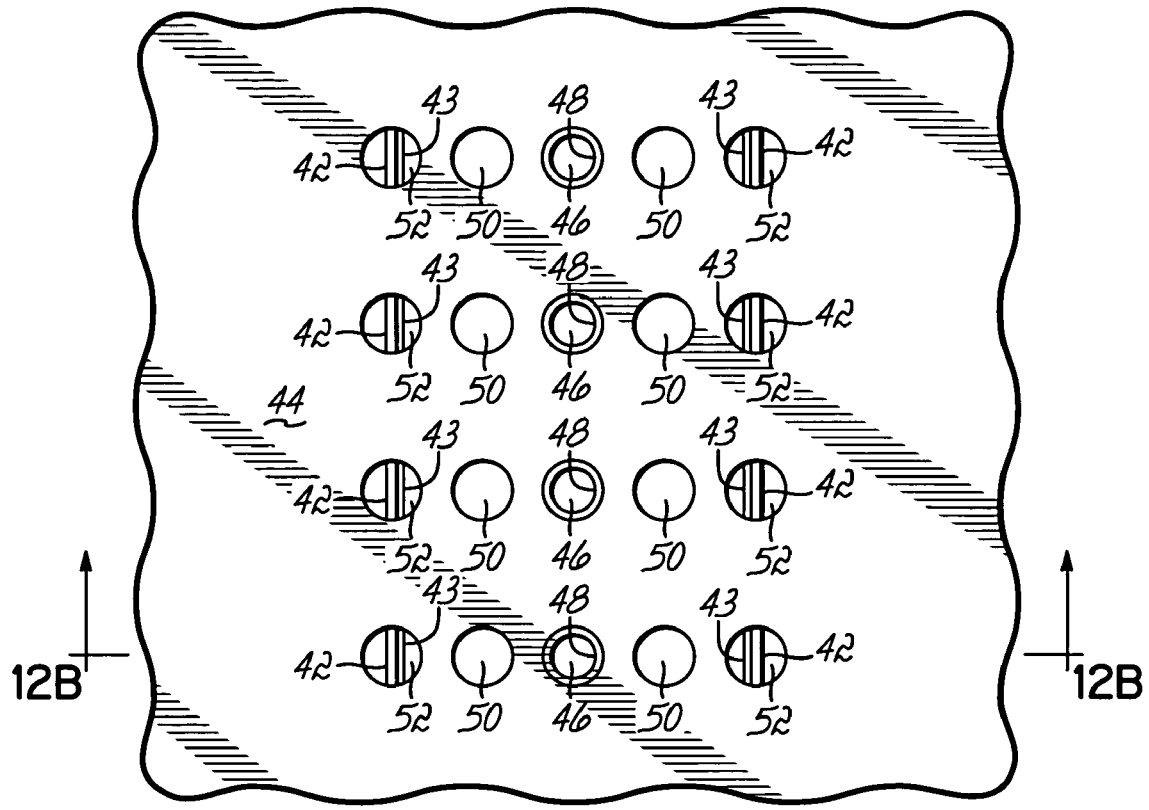
FIG. 12A is a top view similar to FIG. 11A at a subsequent fabrication stage.
Figure 12B:
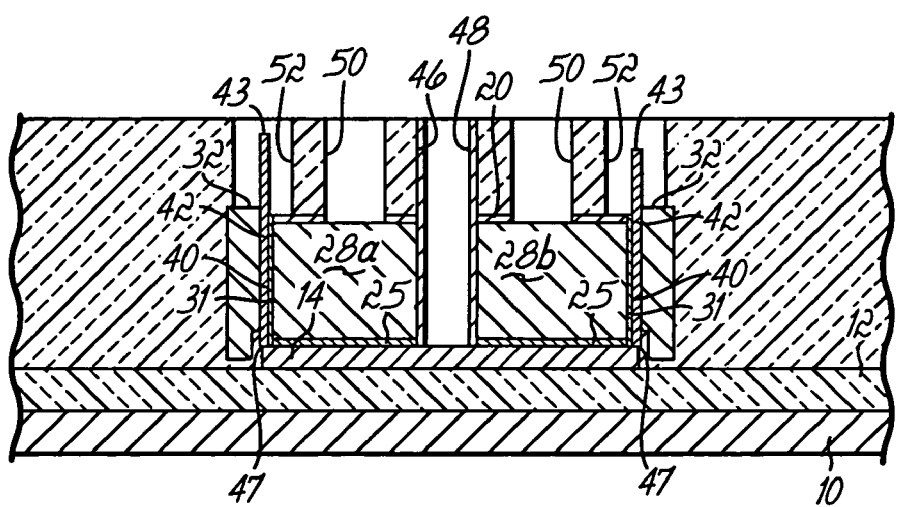
FIG. 12B is a cross-sectional view taken generally along lines 12B—12B in FIG. 12A.

With reference to FIGS. 12A and 12B, contact holes 46 that extend through layer 44, hardmask 20, gate electrode 28, and layer 25 are defined by a standard lithographic and etch process that stops at the depth of the catalyst pad 14. An insulating material is deposited in the contact holes 46 and etched anisotropically to provide insulating spacers 48 that electrically isolate the gate electrodes 28 from the catalyst pad 14. Each gate electrode 28 is partitioned by the corresponding contact hole 46 into two distinct gate electrodes 28*a*, 28*b*. Contact holes 50 are defined in layer 44 and the hardmask 20 by a standard lithographic and etch process that stops at the depth of the gate electrodes 28*a,b*. Contact holes 52 are defined in layer 44 by a standard lithographic and etch process to a depth that exposes a leading tip 43 of at least one of the carbon nanotubes 42 resident in each passage 34.

Figure 13A:
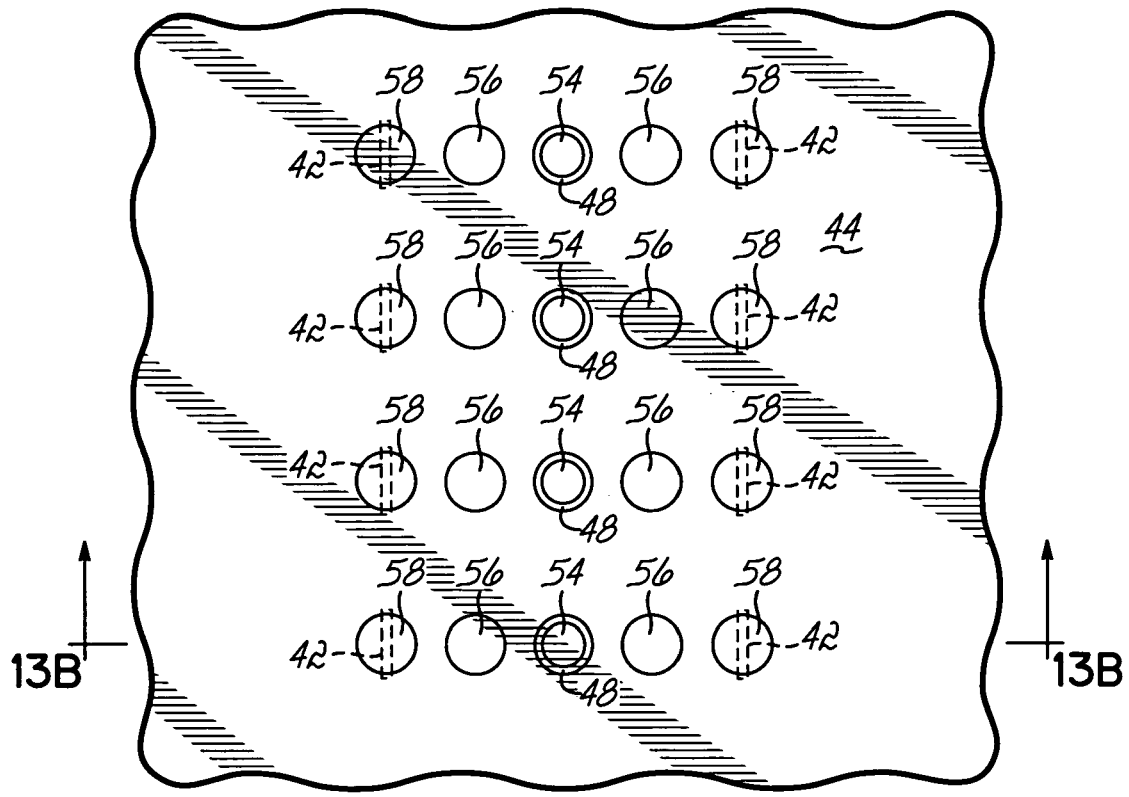
FIG. 13A is a top view similar to FIG. 12A at a subsequent fabrication stage.
Figure 13B:
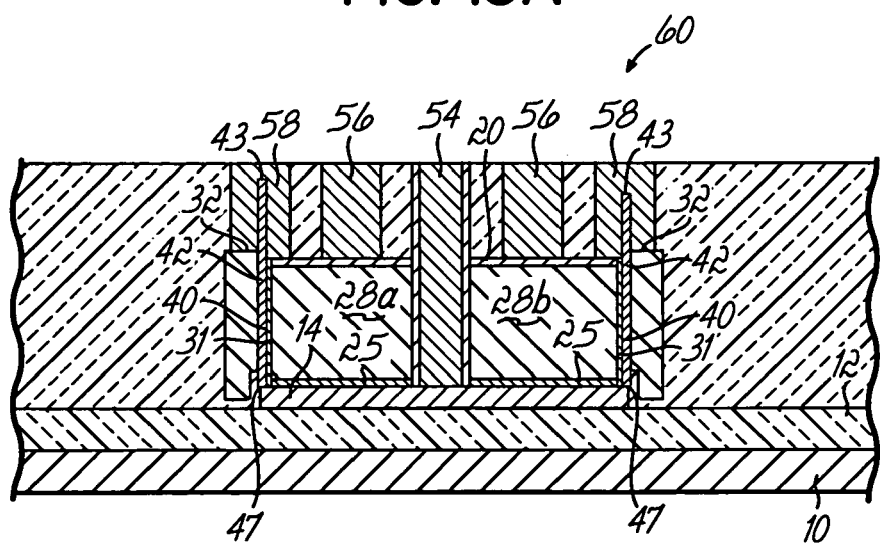
FIG. 13B is a cross-sectional view taken generally along lines 13B—13B in FIG. 13A.

With reference to FIGS. 13A and 13B, contacts 54, 56, and 58 are formed in the contact holes 46, 50 and 52, respectively, by optionally lining the contact openings 46, 50 and 52 with one or more barrier/adhesion enhancement layers (not shown), blanket depositing a suitable metal to fill the contact openings, and then removing the excess overburden of conductive material by any appropriate planarization technique, such as a CMP process, to form a plug. At least one of the carbon nanotubes 42 resident in the passage 34 located adjacent each gate electrode 28*a,b* has a leading tip 43 electrically contacted, preferably ohmically, with a corresponding one of contacts 58. The leading tips 43 of the contacted carbon nanotubes 42 may project vertically into the bulk of the corresponding contact 58 or meet at an interface with the corresponding contact 58. The carbon nanotubes 42 in each passage 34 are electrically coupled, preferably ohmically, with the catalyst pad 14. The contacts 54, 56 and 58 are electrically isolated from each other and are formed from any suitable conducting material including, but not limited to, aluminum (Al), copper (Cu), gold (Au), molybdenum (Mo), tantalum (Ta), titanium (Ti), and tungsten (W). Standard back-end-of-the-line (BEOL) processing is used to fabricate an interconnect structure (not shown) coupling adjacent completed device structures 60.

The device structure 60 forms an FET including one of the gate electrodes 28*a,b*, a gate dielectric defined by layer 40, a source defined by the catalyst pad 14 and contact 54, a drain defined by the corresponding contact 58, and a semiconducting channel region defined along the length of at least one of the carbon nanotubes 42 extending vertically in the appropriate passage 34 between catalyst pad 14 and contact 58. The channel region defined by the carbon nanotubes 42 is oriented substantially vertically relative to the horizontal plane of the substrate 10. Carriers flow selectively from the catalyst pad 14 through the carbon nanotubes 42 to the contact 58 when an electrical voltage is applied to the appropriate one of gate electrodes 28a,b to create a channel in the associated carbon nanotubes 42. Each device structure 60 is electrically coupled for device operation with other devices structures 60 and additional circuit components (not shown) carried by the substrate 10.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A vertical semiconductor device structure, comprising:
a substrate defining a substantially horizontal plane;
a gate electrode projecting vertically from said substrate and including a vertical sidewall;
a semiconducting nanotube extending between opposite first and second ends with a substantially vertical orientation;
a spacer of a dielectric material flanking said vertical sidewall and spaced horizontally from said vertical sidewall of said gate electrode to define a vertical passage having horizontal dimensions appropriate for the synthesis of said semiconducting nanotube, said semiconducting nanotube positioned in said vertical passage, and said spacer extending vertically relative to said gate electrode such that said vertical passage has a vertical dimension greater than or equal to a vertical height of said vertical sidewall of said gate electrode;
a gate dielectric disposed on said vertical sidewall between said semiconducting nanotube and said gate electrode;
a source electrically coupled with said first end of said semiconducting nanotube; and
a drain electrically coupled with said second end of said semiconducting nanotube.

2. The semiconductor device structure of claim 1 wherein said source is composed of a catalyst material effective for synthesizing said semiconducting nanotube by a chemical vapor deposition process.

3. The semiconductor device structure of claim 1 wherein said drain comprises a catalyst material effective for synthesizing said semiconducting nanotube by a chemical vapor deposition process.

4. The semiconductor device structure of claim 1 wherein said spacer is separated from said substrate by a gap, said gap being filled by an insulating material after said semiconducting nanotube is formed.

5. The semiconducting device structure of claim 1 wherein said semiconducting nanotube is composed of arranged carbon atoms.

6. The semiconducting device structure of claim 1 wherein said vertical passage has a rectangular cross-sectional profile when viewed in a vertical direction.

7. The semiconducting device structure of claim 1 wherein said source is composed of a catalyst material effective for synthesizing said semiconducting nanotube by a chemical vapor deposition process, said source positioned on said substrate in vertical alignment with said vertical passage.

8. The semiconducting device structure of claim 7 wherein said spacer is vertically spaced relative to said substrate to define a gap communicating with said passage, said gap and said vertical passage collectively providing a pathway for a reactant to said catalyst material of said source for growing said semiconducting nanotube by a chemical vapor deposition process.

9. The semiconducting device structure of claim 8 further comprising:
an insulating material filling said gap, said insulating material placed in said gap after said semiconducting nanotube is grown by the chemical vapor deposition process.

10. The semiconducting device structure of claim 1 further comprising:
a plurality of semiconducting nanotubes positioned horizontally between said gate electrode and said spacer, each of said plurality of semiconducting nanotubes extending vertically in said vertical passage between opposite first and second ends.

11. The semiconducting device structure of claim 10 further comprising:
an insulating material filling space within said vertical passage not occupied by said plurality of semiconducting nanotubes.

12. The semiconducting device structure of claim 1 further comprising:
a plurality of semiconducting nanotubes positioned horizontally between said gate electrode and said spacer, each of said plurality of semiconducting nanotubes extending vertically between opposite first and second ends.

13. The semiconducting device structure of claim 12 wherein at least one of said plurality of semiconducting nanotubes has said first end electrically coupled with said source and said second end electrically coupled with said drain.

14. A semiconductor device structure, comprising:
a substrate;
a gate electrode projecting from said substrate and including a sidewall;
a spacer of a dielectric material flanking said sidewall to define a passage;
a semiconducting nanotube positioned in said passage between said sidewall and said spacer and extending between opposite first and second ends;
a gate dielectric disposed on said sidewall between said semiconducting nanotube and said gate electrode;
a source electrically coupled with said first end of said semiconducting nanotube; and
a drain electrically coupled with said second end of said semiconducting nanotube, said gate electrode being positioned between said drain and said source.

15. The semiconductor device structure of claim 14 wherein said spacer is separated from said substrate by a gap and said passage communicates with said gap, and further comprising:

an insulating material filling said gap and portions of said passage unfilled by said semiconducting nanotube.

16. The semiconductor device structure of claim 14 wherein said spacer is separated from said substrate by a gap, and further comprising:

an insulating material filling said gap.

17. The semiconductor device structure of claim 14 further comprising:

an insulating material filling portions of said passage unfilled by said semiconducting nanotube.

18. The semiconductor device structure of claim 14 wherein said source is composed of a catalyst material effective for synthesizing said semiconducting nanotube by a chemical vapor deposition process.

19. A semiconductor device structure fabricated on a substrate, the semiconductor device structure comprising:

a gate electrode projecting from the substrate and including a sidewall;

a spacer of a dielectric material flanking said sidewall of said gate electrode to define a passage;

a semiconducting nanotube positioned in said passage between said sidewall of said gate electrode and said spacer, said semiconducting nanotube extending between opposite first and second ends;

a gate dielectric disposed on said sidewall of said gate electrode between said semiconducting nanotube and said gate electrode;

a source electrically coupled with said first end of said semiconducting nanotube; and a drain electrically coupled with said second end of said semiconducting nanotube, said gate electrode being positioned between said drain and said source, and said semiconducting nanotube having a length such that said second end of said semiconducting nanotube projects beyond said gate electrode and into said drain.

20. The semiconductor device structure of claim 19 wherein said source is composed of a catalyst material effective for synthesizing said semiconducting nanotube by a chemical vapor deposition process.

21. The semiconductor device structure of claim 19 wherein said spacer is separated from the substrate by a gap communicating with said passage.

22. The semiconductor device structure of claim 21 further comprising: an insulating material filling said gap.

23. The semiconductor device structure of claim 21 further comprising:

an insulating material filling said gap and portions of said passage unfilled by said semiconducting nanotube.

24. The semiconductor device structure of claim 19 further comprising:

an insulating material filling portions of said passage unfilled by said semiconducting nanotube.

* * * * *